United States Patent [19]

Iguchi et al.

[11] Patent Number: 5,314,835
[45] Date of Patent: May 24, 1994

[54] SEMICONDUCTOR MEMORY DEVICE

[75] Inventors: Katsuji Iguchi, Yamatokoriyama; Seizo Kakimoto, Nara; Naoyuki Shinmura, Tenri, all of Japan

[73] Assignee: Sharp Kabushiki Kaisha, Osaka, Japan

[21] Appl. No.: 972,914

[22] Filed: Nov. 6, 1992

Related U.S. Application Data

[60] Division of Ser. No. 794,846, Nov. 21, 1991, which is a continuation of Ser. No. 540,759, Jun. 20, 1990, abandoned.

[30] Foreign Application Priority Data

Jun. 20, 1989 [JP] Japan .................................. 1-158028

[51] Int. Cl.$^5$ ............................................. H01L 21/70
[52] U.S. Cl. ..................................... 437/52; 437/47; 437/60; 437/919
[58] Field of Search ................. 437/47, 48, 52, 60, 437/233, 235, 919; 257/309

[56] References Cited

U.S. PATENT DOCUMENTS

| | | | |
|---|---|---|---|
| 5,047,817 | 9/1991 | Wakamiya | 257/306 |
| 5,140,389 | 8/1992 | Kimura | 257/306 |

FOREIGN PATENT DOCUMENTS

| | | |
|---|---|---|
| 0295709 | 12/1988 | European Pat. Off. . |
| 317199 | 5/1989 | European Pat. Off. . |
| 62-48062 | 2/1987 | Japan . |
| 174752 | 3/1989 | Japan . |
| 1073655 | 3/1989 | Japan . |

OTHER PUBLICATIONS

"A Novel Storage Capacitance Enlargement Structure Using Double Stacked Storage Node in STC DRAM Cells" Ex. Abstracts 20th Int. Conf. on Solid State Devices and Materials, Tokyo, 1988 pp. 581–584.
Novel Stacked Capacitor Cell for 64 Ml DRAM. VLSI Technology Symposium 1987, Kyoto, pp. 69–70.
"Stacked Capacitor Cells for High-Density Dynamic RAMs" ULSI Research Center, IEDM 88, pp. 600–664.
"A New Stacked Capacitor DRAM Cell Characterized by a Storage Capacitor on a Bit-Line Structure" IEDM 88.
"3-Dimensional Stacked Capacitor Cell for 16M and 64M DRAMS" IEDM 88, pp 592–595.

*Primary Examiner*—Tom Thomas

[57] ABSTRACT

A semiconductor memory device includes a plurality of memory cells each including a transistor formed on a surface of a semiconductor substrate and having one terminal, and a capacitor formed on the semiconductor substrate and having first and second electrodes, with the first electrode being connected with one terminal of the transistor. The first electrode of the capacitor includes of a principal portion of either a generally rectangular cubic configuration or a generally cup-shaped configuration, a peripheral portion spaced from and surrounding a peripheral side wall of the principal portion and a bottom portion connecting an end of the principal portion with an end of the peripheral portion. On the other hand, the second electrode of the capacitor is includes of respective portions confronting the principal portion, the peripheral portion and the bottom portion of the first electrode.

4 Claims, 9 Drawing Sheets

SEMICONDUCTOR MEMORY DEVICE

This application is a divisional of copending application Ser. No. 07/794,846, filed on Nov. 21, 1991. The entire contents of which are hereby incorporated by reference, which was a continuation of copending application Ser. No. 07/540,759, filed on Jun. 20, 1990, now abandoned.

BACKGROUND OF THE INVENTION

1. Field of the Invention

The present invention relates generally to the structure of a semiconductor memory element and, more particularly, to memory cells for DRAMs (dynamic random access memories) and a method of making the same.

2. Description of the Related Art

The storage capacity of DRAMs, one of the highly sophisticated high-density storage elements, has increased at a multiplication of 4 in three years, and it is suspected that the DRAMs would be designed to have a storage capacitor increasing from 4M, 16M, 64M and so on with passage of time. In order to accomplish the fabrication of high-density RAMs, memory cells used in the DRAM as storage elements must have a reduced size. On the other hand, in order to obtain an immunity against soft error which would result from radiations and also to secure signals of sufficient S/N ratio, the charge storage capacitance of each memory cell must be of a value higher than a certain minimum value. Because of this, it is not possible to form a charge storage capacitor on a semiconductor surface in DRAMs having a storage capacity higher than 4M. Instead, it is a recent trend to fabricate a three-dimensional memory cell structure wherein the charge storage capacitor is formed in a hole or a groove defined in a semiconductor substrate or over a MOS transistor formed on a surface of the semiconductor substrate.

The technique in which the charge storage capacitor is formed in the hole or groove defined in the semiconductor substrate, that is, inside a trench, is advantageous in that, because the charge storage capacitance can be increased depending on the depth of the trench, the memory cell can be reduced in size. However, this technique has a disadvantage in that it is not technically easy to form a relatively deep trench with good reproducibility.

On the other hand, a stacked memory cell which has the charge storage capacitor formed over the MOS transistor, is relatively suited for production. However, when as compared with the capacitance of the memory cell utilizing the trench, the stacked memory cell has a limited capacitance and is not suited for use in DRAMs where the latter are desired to have an increased storage capacity of from 16M towards 64M. This is because a reduction in cell size tends to result in an abrupt decrease of the charge storage capacitance because the polycrystalline silicon film forming charge storage electrodes in the stacked memory cell has a relatively small thickness, for example, about 0.3 μm which allows most of the charges to be accumulated on surface areas of the electrodes.

SUMMARY OF THE INVENTION

In view of the foregoing, the present invention has been devised to provide a semiconductor memory device having stacked memory cells which can have a charge storage capacitance equal to or higher than the minimum value even where they are integrated in a high density so as to have a memory capacity of 16M, 64M or more.

Another important object of the present invention is to provide a method of making the semiconductor memory device of the type referred to above.

To this end, the present invention provides a semiconductor memory device which comprises a plurality of memory cells each comprising a transistor formed on a surface of a semiconductor substrate and having one terminal, and a capacitor formed on the semiconductor substrate and having first and second electrodes, said first electrode being connected with one terminal of the transistor. The first electrode of the capacitor is comprised of a principal portion of either generally cylindrical configuration or a generally cup-shaped configuration, a peripheral portion spaced from and surrounding a peripheral side wall of the principal portion and a bottom portion connecting an end of the principal portion with an end of the peripheral portion. On the other hand, the second electrode of the capacitor is comprised of respective portions confronting the principal portion, the peripheral portion and the bottom portion of the first electrode.

Preferably, the number of each peripheral and bottom portion of said first electrode may be plural.

Also, the present invention provides a method of making the semiconductor memory device, of the type referred to above, which comprises a first step of forming an electroconductive thick film as a material for the first electrode of the capacitor after the transistor has been formed on a surface of the semiconductor substrate, a second step of forming a side wall of the principal portion of the capacitor by removing a portion of the electroconductive thick film excluding a region thereof on which the principal portion of the capacitor is to be formed while leaving a thin film portion, a third step of forming the peripheral side wall made of material selectively etched relative to the electroconductive thick film and surrounding a periphery of the side wall of the principal in contact therewith, a fourth step of forming a peripheral portion made of electroconductive material resistant to a corrosive used for the material for the peripheral side wall so that the peripheral portion surrounds the peripheral side wall in contact therewith and having an end portion connected therethrough to the thin film portion, a fifth step of forming a bottom portion by removing a portion of the thin film on a region outside the peripheral portion, and a sixth step of removing the outer peripheral side wall by the use of a corrosive, whereby an insulating layer and the second electrode are sequentially formed over the first electrode.

Preferably, the third and fourth steps are repeated.

According to the present invention, because the first electrode of the capacitor is comprised of the principal portion, the peripheral portion and the bottom portion connected together while the second electrode of the same capacitor is comprised of respective portions confronting the principal portion, the peripheral portion and the bottom portion of the first electrode, the area of surface of the first and second electrodes which confront with each other increase enough to permit the charge storage capacitance to increase as compared with the case in which the first electrode is comprised of only the principal portion. Moreover, because the peripheral portion of the first electrode surrounds the peripheral side wall of the principal portion of either a generally rectangular cubic configuration or a generally cup-shaped configuration, the area of surface of the first and second electrodes which confront with each other can be increased with no need to increase the surface area of the bottom of this electrode. Accordingly, a charge storage capacitance higher than the minimum value can be secured when a high density integration is desired to be achieved.

Where the number of each of the peripheral portion and the bottom portion of said first electrode is plural, an advantage can be obtained so that the charge storage capacitance can further be increased for a surface area of the first electrode.

Also, because the peripheral side wall surrounding and held in contact with the side wall of the principal portion of the first electrode and the peripheral portion surrounding and held in contact with this peripheral side wall are formed in a self-aligned fashion without the lithographic technique employed, the distance between each neighboring capacitor in the memory cell can be set to a value smaller than the minimum distance achieved by the lithographic technique. Accordingly, the cell surface area can be effectively utilized to secure a charge storage capacitance higher than the minimum value when a high density integration is desired to be achieved.

The repetition of the steps of forming the peripheral portion and the bottom portion, respectively, can result in the formation of capacitor having a large capacitance without the number of masks being increased.

BRIEF DESCRIPTION OF THE DRAWINGS

These and other objects and features of the present invention will become clear from the following detailed description of preferred embodiments thereof with reference to the accompanying drawings, in which:

FIGS. 2B, 2D, 2F, 2H, 2J and 2K are cross-sectional views taken along the lines X—X in FIGS. 2A, 2C, 2E, 2G, 2I and 2K, respectively;

DETAILED DESCRIPTION OF THE EMBODIMENT

Figure 1:
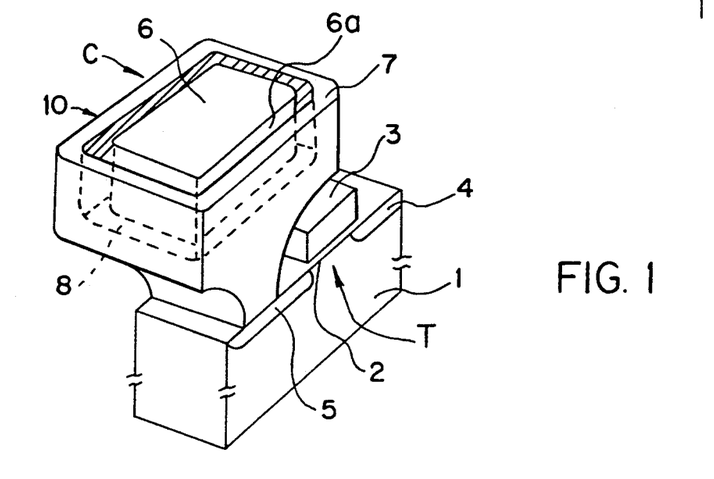
FIG. 1 is a schematic perspective view of an essential portion of a semiconductor memory device according to a first preferred embodiment of the present invention.

Referring first to FIG. 1 illustrating a semiconductor memory element according to a first preferred embodiment of the present invention, the semiconductor memory element illustrating therein is of a so-called stacked structure and includes a transistor T formed on a surface of a semiconductor substrate 1 and a capacitor C positioned above the transistor T. The transistor T includes a source region 5, a drain region 4, a gate insulating layer 2 and a gate electrode 3 formed on the gate insulating layer 2. The capacitor C includes a first or lower electrode 10 connected with the source region 5 of the transistor T, a second or upper electrode (not shown), and an insulating layer (not shown) positioned between the first or lower and second or upper electrodes.

The first electrode 10 includes a principal portion 6 of a generally rectangular cubic configuration having a peripheral side wall 6a, a peripheral portion 7 spaced a distance from and surrounding the peripheral side wall 6a of the principal portion 6, and a bottom portion 8 integrating an end of the principal portion 6 and an end of the peripheral portion 7. On the other hand, the second electrode includes respective portions confronting the principal portion 6, the peripheral portion 7 and the bottom portion 8, respectively.

The semiconductor memory elements of the above described construction is manufactured by a process which will now be described with reference to FIG. 2 which includes of FIGS. 2A, 2B, 2C, 2D, 2E, 2F, 2G, 2H, 2I, 2J, 2K and 2L. It is, however, to be noted that FIGS. 2A, 2C, 2E and 2G, 2I and 2K are top plan views of the semiconductor memory device, respectively, whereas FIGS. 2B and 2D, 2F, 2H, 2J and 2L are cross-sectional views taken along the lines X—X in FIGS. 2A, 2C, 2E, 2G, 2I and 2K, respectively. It is also to be noted that a pair of parallel single-dotted phantom lines employed in each of these figures forming FIG. 2 represent a region of the semiconductor memory device which is occupied by a single memory cell including of the previously mentioned transistor T and capacitor C. In describing the method of making the semiconductor memory device according to the present invention, reference will be made only to the fabrication of the single memory cell and, therefore, those parts of adjacent memory cells which function similarly to those parts of the memory cell discussed hereinafter and which are formed on respective sides of the memory cell discussed hereinafter in substantially symmetrical relation will be identified with like reference numerals to which a single prime (') and a double prime (") are respectively affixed.

Also, for facilitating a better understanding of the present invention, the method steps will be described individually under separate headings.

Figure 2A:
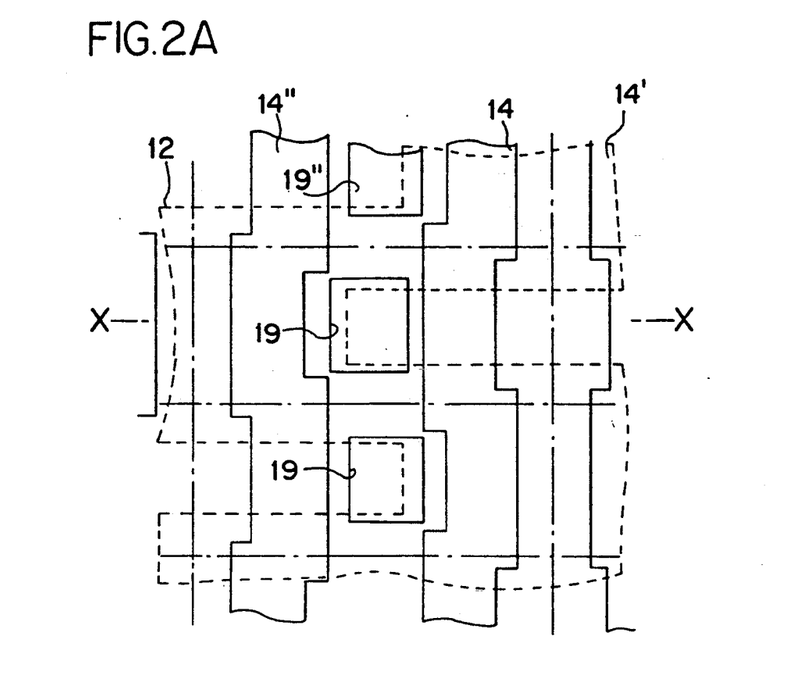
FIGS. 2A, 2C, 2E, 2G, 2I and 2K are top plan views of the semiconductor memory device, illustrating the sequence of manufacture thereof at different process steps, respectively.
Figure 2B:
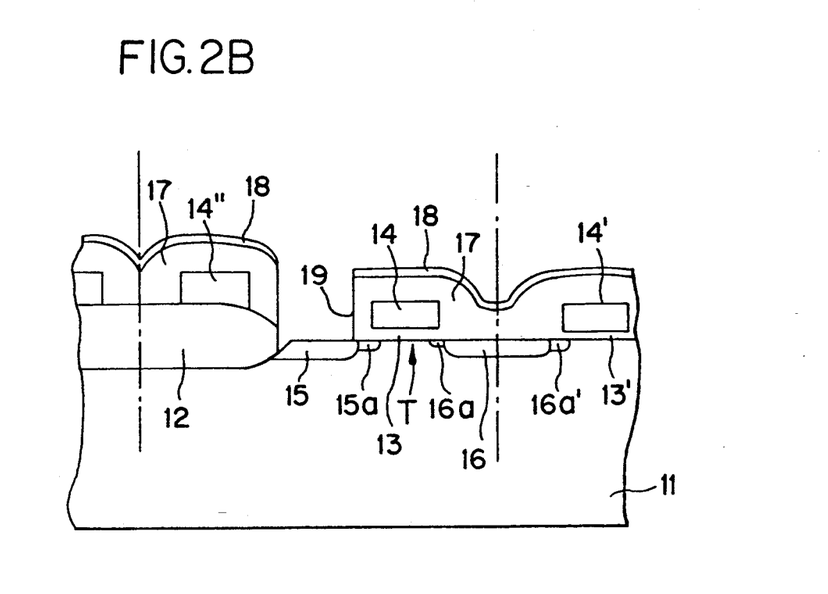

Method Step 1—FIGS. 2A and 2B:

In a manner well known to those skilled in the art, the transistor T is formed on a surface of a P-type silicon substrate 11, followed by the formation, as interlayer insulating layers, of a $SiO_2$ layer 17 and a $Si_3N_4$ layer 18. Respective portions of the $SiO_2$ and $Si_3N_4$ layers 17 and 18 aligned with a source region 15 of the transistor T are subsequently removed to defined a contact hole 19. A region 12 specifically illustrated by the phantom line in FIG. 2A represents a cell separating area formed of $SiO_2$ by the use of a selective oxidization process. Reference numerals 13 and 13' represent gate insulating layers each formed of $SiO_2$ by the use of a thermal oxidization process; reference numerals 14, 14' and 14" represent gate electrodes (word lines) each formed of phosphor-doped polycrystalline silicon; reference numerals 15 and 16 represent the source region of $N^+$-type and a drain region of $N^+$-type, respectively, each of the regions being formed by injecting arsenic ions into the substrate 11; and reference numerals 15a, 16b and 16a' represent respective $N^-$ regions formed by injecting phosphor ions into the substrate 11 and having a LDD (light doped drain) structure.

It is to be noted that the $Si_3N_4$ layer 18 is formed for the purpose of protecting the $SiO_2$ layer 17, positioned beneath the $Si_3N_4$ layer 18, from a subsequently performed hydrochlorination (as will be described under the heading of Method Step 5) and has a sufficient film thickness selected in consideration of a possible reduction in film thickness which would occur as a result of the layer being somewhat etched off at the time of etching of the polycrystalline silicon during the execution of the Method Step 4 as will be described later.

Figure 2C:
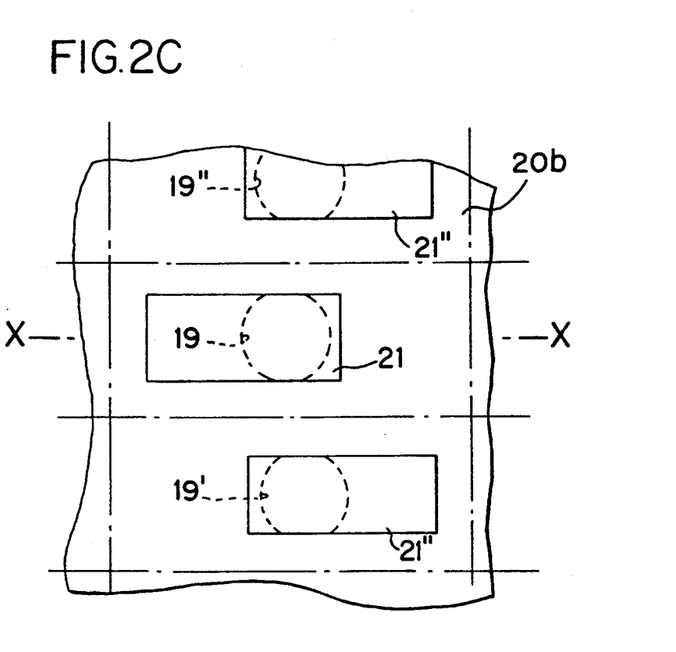
Figure 2D:
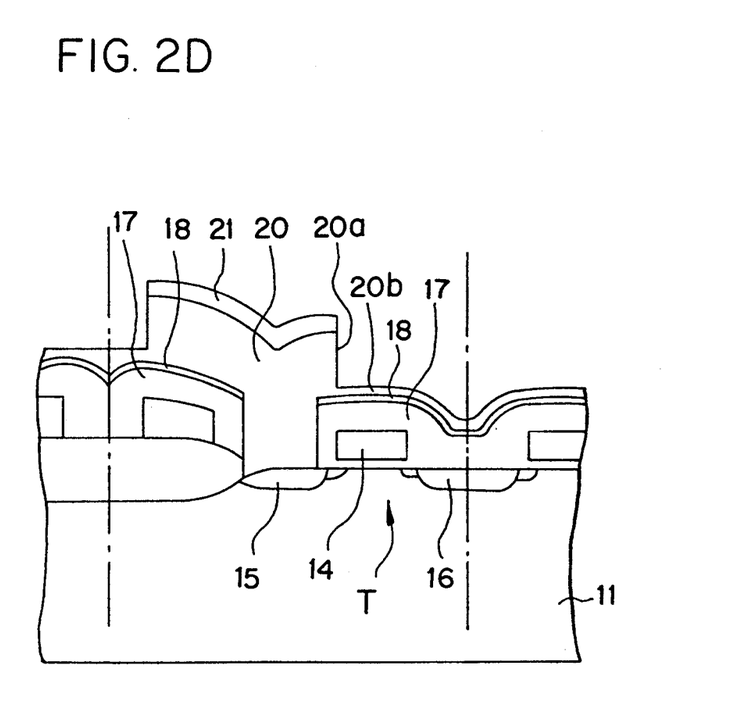

Method Step 2—FIGS. 2C and 2D:

As material for the first electrode 10 of the capacitor C, a phosphor-doped polycrystalline silicon layer 20 of relatively great film thickness as material for the first electrode 10 of the capacitor C and a $SiO_2$ layer 21 as a masking material used during the etching of the phosphor-doped polycrystalline silicon layer 20 are formed over the entire surface of the assembly. Then, using, a resist layer formed by the use of a lithographic technique as a mask, the $SiO_2$ layer 21 is processed by reactive ion etching process to define the generally rectangular electrode. After the removal of the resist layer, the $SiO_2$ layer 21 so processed as hereinabove described is used as a mask with which the polycrystalline silicon layer 20 having a relatively great film thickness is etched off leaving a thin film portion 20b. A thick film portion of the polycrystalline silicon layer 20 corresponds to the principal portion 6 of the first electrode 10 illustrated in and described with reference to FIG. 1. It is to be noted that, where a semiconductor memory element described and disclosed in the Japanese Patent Application No. 63-227945, filed Sep. 12, 1988, in the name of the same assignee of the present invention is to be fabricated, that portion of the polycrystalline silicon layer 20 which is positioned above a region from which the $SiO_2$ layer 21 has been removed is completely removed so that the first electrode 10 can be constituted only by the principal portion 6.

Figure 2E:
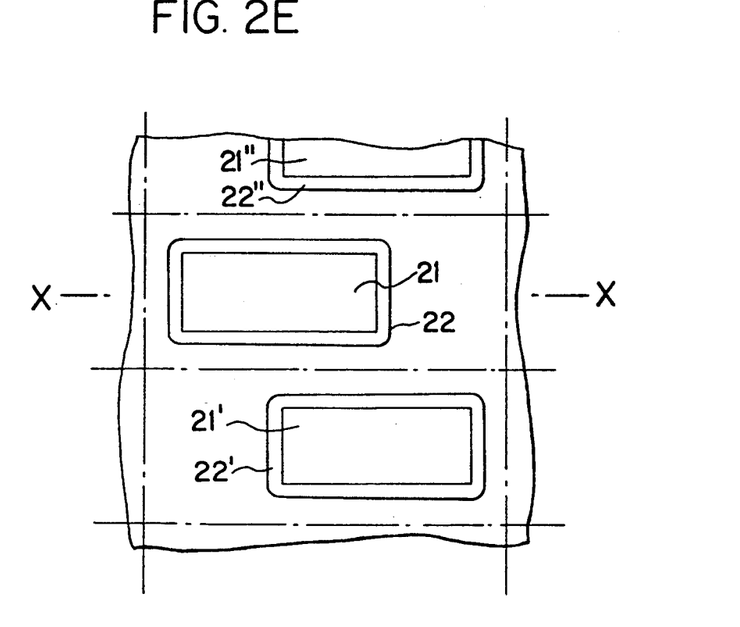
Figure 2F:
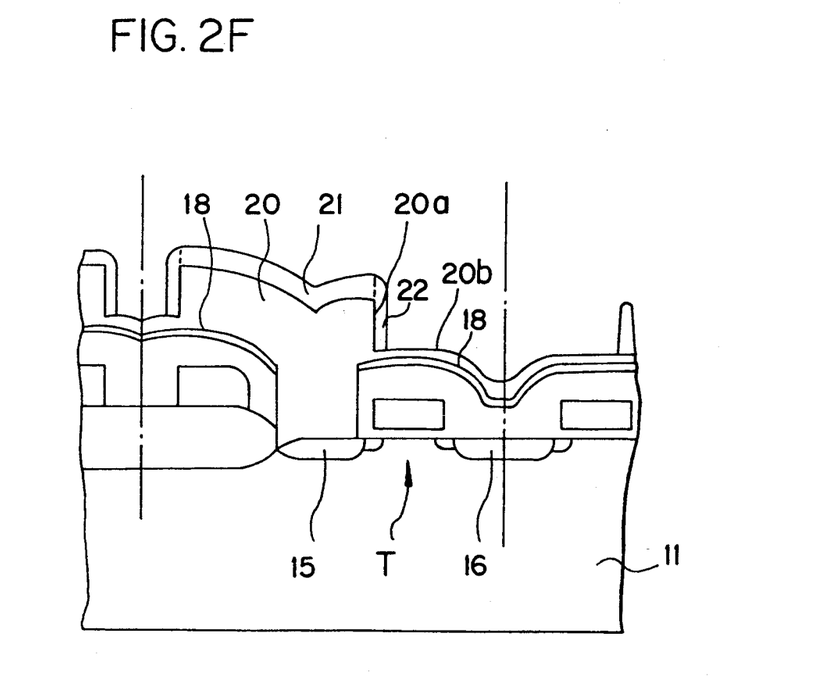

Method Step 3—FIGS. 2E and 2F:

By the use of a reduced pressure gas growth (LPCVD) method, a $SiO_2$ layer capable of exhibiting a good coverage of steps is formed over the entire surface of the assembly and, subsequently, a flat portion of the $SiO_2$ layer so formed, except for a different portion (steps) thereof corresponding to a side wall 20a of the polycrystalline silicon layer 20, is removed by the use of a reactive ion etching process. In this way, as illustrated in FIGS. 2E and 2F, a peripheral side wall 22 including the $SiO_2$ layer is formed on the side wall 20a of the polycrystalline silicon layer 20. It is to be noted that a reduced pressure CVD process is employed for the purpose of making it possible to form the $SiO_2$ layer of sufficient film thickness on the side walls 20a of the polycrystalline silicon layer 20 and, also, the reactive ion etching process is employed for avoiding the peripheral side wall 22 form being etched off. It is also to be noted that, as material for the peripheral side wall 22, any material capable of being etched off selectively relative to the polycrystalline Si 20 can be employed in place of the $SiO_2$.

Figure 2G:
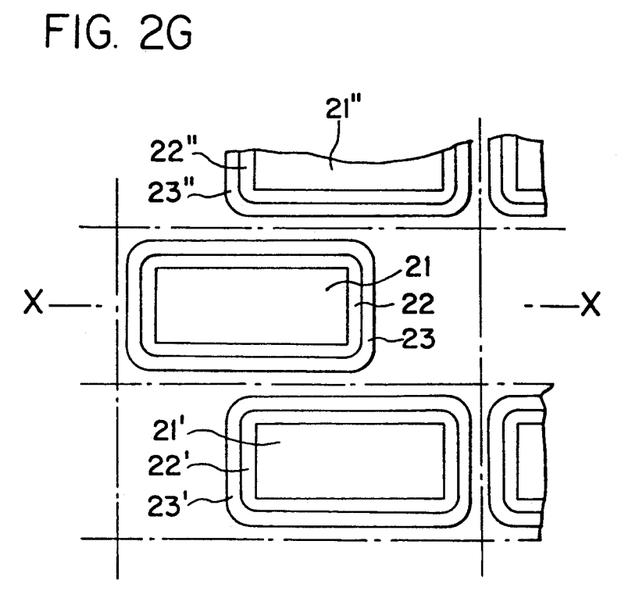
Figure 2H:
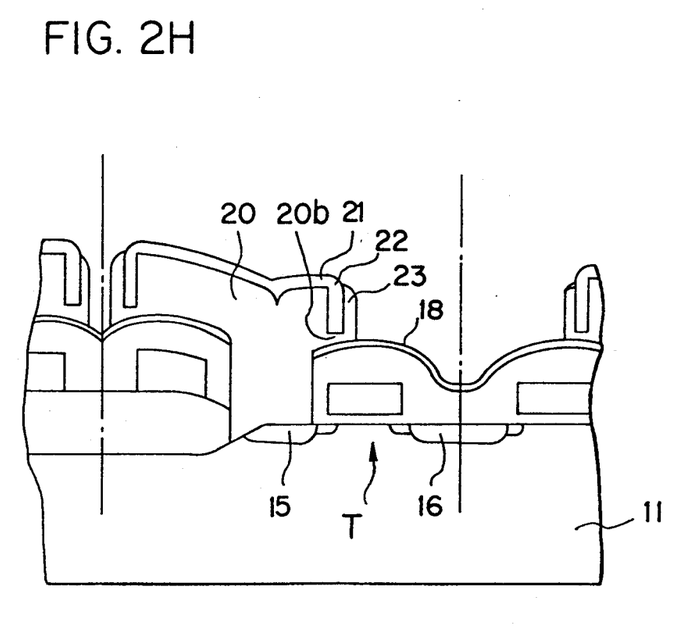

Method Step 4—FIGS. 2G and 2H:

After the formation of the polycrystalline silicon layer over the entire surface, both of the polycrystalline silicon layer and the thin film portion 20b of the polycrystalline silicon layer 20 are completely etched off except for respective portions thereof corresponding to the step. In this way, as illustrated in FIGS. 2G and 2H, a generally ring-shaped polycrystalline silicon 23 formed of polycrystalline silicon and exteriorly surrounding the peripheral side wall 22 with a bottom thereof continuing to the thin film portion 20b is formed. This polycrystalline silicon 23 corresponds to the peripheral portion 7 of the first electrode 10 illustrated in and described with reference to FIG. 1. At the same time, a portion of the thin film portion 20b corresponding to an outer region of the polycrystalline silicon 23 is removed to form the bottom portion 8 of the first electrode 10. The thick film portion of the polycrystalline silicon layer 20 is then electrically connected with the generally ring-shaped polycrystalline silicon 23 through the thin film portion 20b. It is to be noted that, although material for the peripheral portion 7 of the first electrode 10 has been the same as the method for the principal portion 6, that is, the polycrystalline silicon, it may not be limited thereto and an electroconductive material of a type which will not be attacked by a corrosive used to remove the peripheral wall 22 during the method step 5 as will be described later may be employed for peripheral portion 7 of the first electrode 10. Also, it is preferred that the polycrystalline silicon layer 20b is etched selectively relative to the $Si_3N_4$ layer 18 when the former is to be etched.

Figure 2I:
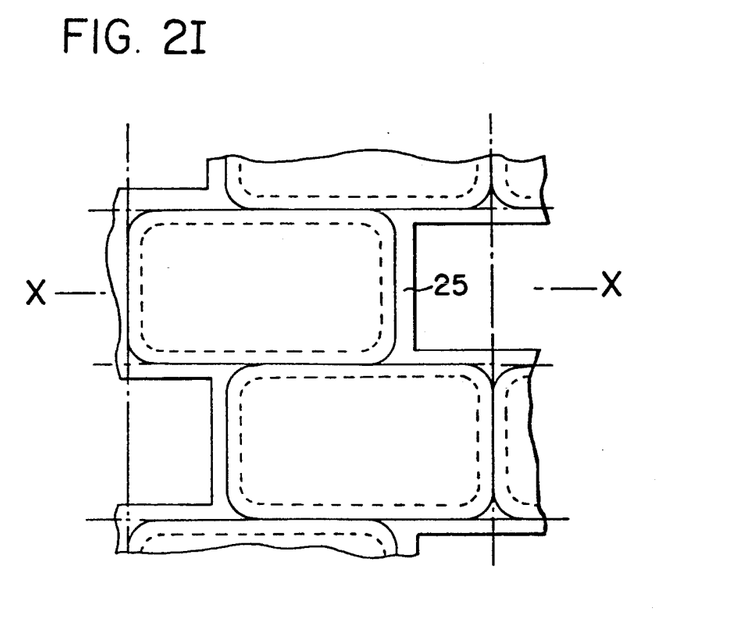
Figure 2J:
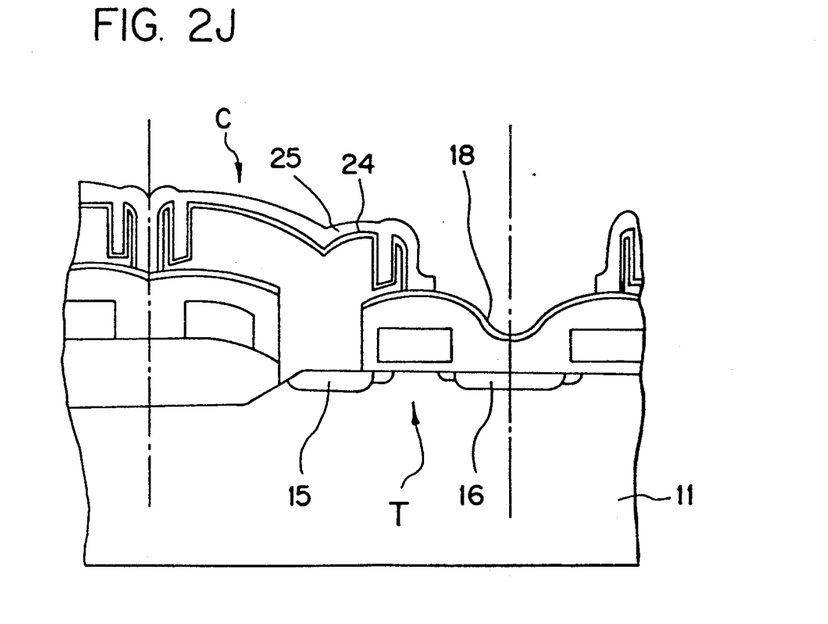

Method Step 5—FIGS. 2I and 2J:

Thereafter, as illustrated in FIGS. 2I and 2J, the $SiO_2$ layer 21 and the peripheral side wall 22 formed of a $SiO_2$ film are removed by the use of an etching solution containing hydrofluoric acid (HF). Subsequently, a capacitor insulating layer 24 of the capacitor C is formed and a plate electrode 25 which may eventually form a wiring common to all of the memory cells is formed as one electrode of the capacitor C. The capacitor insulating layer 24 is in the form of a $SiO_2/Si_3N_4$ double-layered film obtained by forming a $Si_3N_4$ layer by the use of the LPCVD process and then oxidizing a surface of the $Si_3N_4$ layer by wet oxidization. Also, the plate electrode 25 is made of phosphor-doped polycrystalline silicon.

Figure 2K:
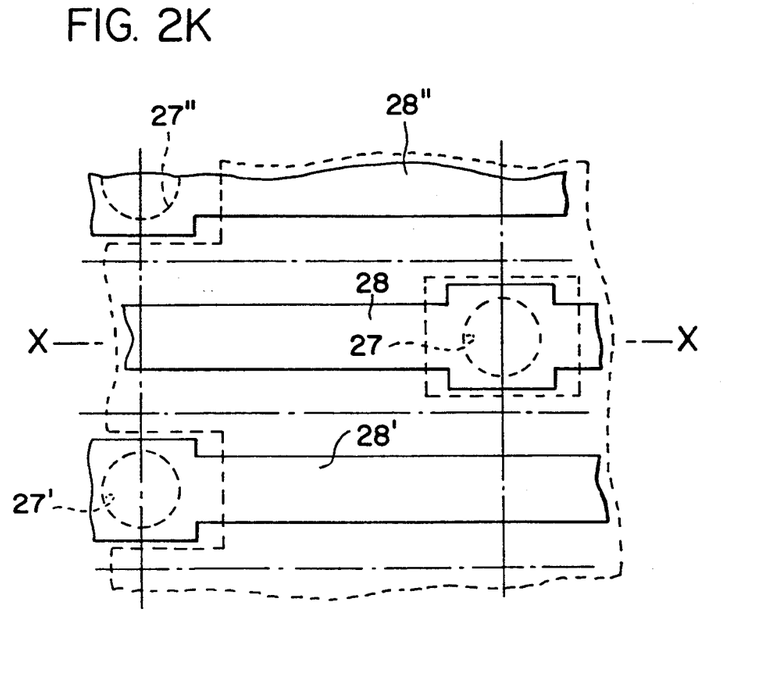
Figure 2L:
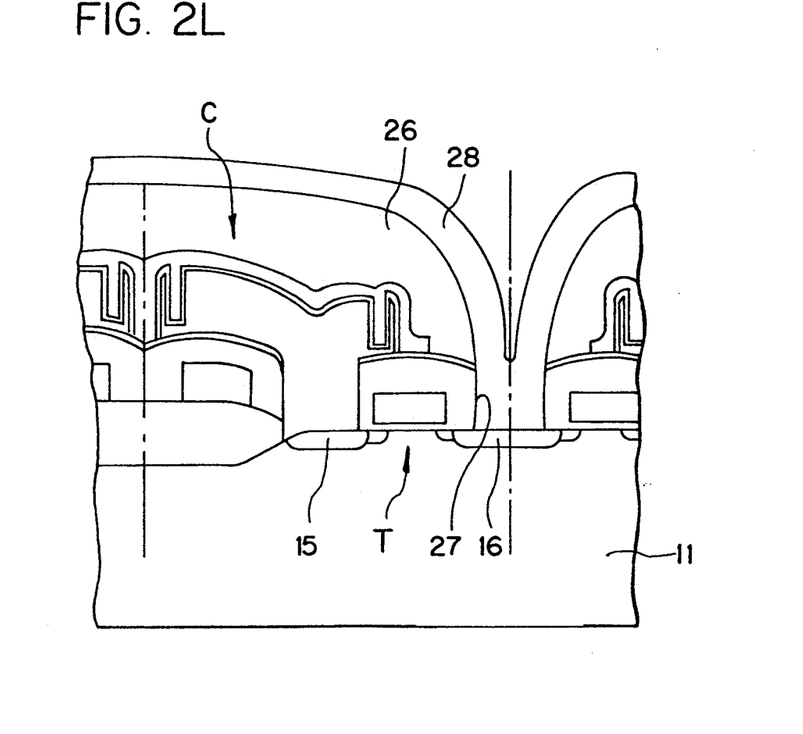

Method Step 6—FIGS. 2K and 2L:

Finally, as illustrated in FIGS. 2K and 2L, after the formation of an interlayer insulating film 26, a contact hole 27 is opened above the drain region 16 of the transistor T, followed by the formation of a common wiring (bit line) 28, thereby completing the manufacture of the semiconductor memory element illustrated in FIG. 1.

Where the semiconductor memory element of the construction described hereinbefore is manufactured at a minimum line width of 0.5 $\mu$m, the memory cell size will be 3 $\mu$m $\times$ 1.2 $\mu$m = 3.6 $\mu$m$^2$. If the thickness of the polycrystalline silicon electrode 20 is 0.5 $\mu$m and the size of the $SiO_2$ mask 21 is 0.6 $\mu$m $\times$ 1.35 $\mu$m, the area of surfaces of the polycrystalline silicon electrode calculated from this size will be 2.8 $\mu$m$^2$. In such case, the conventional stacked memory cell would utilize a surface area of about 3 $\mu$m$^2$ for the capacitor. However, in the semiconductor memory element according to the present invention, where the peripheral portion 7 formed of the polycrystalline silicon film of 0.1 $\mu$m in thickness is connected by forming the peripheral side wall of $SiO_2$ of 0.1 $\mu$m in film thickness on the principal portion 6, a surface area of about 7.6 $\mu$m$^2$ can be utilized for the capacitor. Indeed, a comparative measurement of the capacitance of the capacitor per memory cell has indicated that, while the capacitance in the conventional stacked memory cell was 17 fF, the capacitance of the capacitor per memory cell in the memory device of the construction described hereinbefore according to the present invention was 42 fF. Therefore, the capacitor of the present invention can be effectively utilized in the DRAM of 16M. Neither the leakage current nor a considerable deterioration in lifetime of the capacitor insulating film was found.

Thus, the provision of the peripheral portion 7 surrounding the side wall 6a of the principal portion 6 of a generally cubic configuration which forms the first electrode 10, makes it possible to increase the area of surface confronting the capacitor C without unnecessarily increasing the bottom surface area of the first electrode 10. Also, because both of the peripheral side wall 22 and the peripheral portion 23 are provided in a self-aligned fashion without employing any lithographic technique, the distance between each neighboring capacitor C in the semiconductor memory device can be reduced to a value smaller than the limit imposed by the lithographic technique. Therefore, the elements can be integrated in a high density and there is no need to increase the number of the masks.

Although in the foregoing embodiment the peripheral portion 7 of the first electrode has been described as of a generally ring-shape, the peripheral portion 7 of the first electrode may be formed in a shape similar to two or more coaxial rings. By way of example, a process from the method step 3 to the method step 4 (corresponding to FIGS. 2E and 2F and FIGS. 2G and 2H, respectively) may be repeated twice to form the peripheral portion 7 of a shape similar to the two coaxial rings.

More specifically, during the execution of the method step 4, the thin film 20b of polycrystalline silicon is allowed to remain when the first ring of polycrystalline silicon 23 is to be formed by the use of the reactive ion etching process. Then, the method step 3 is executed to form the peripheral side wall in the form of a $SiO_2$ film, followed by the formation of a second ring of the peripheral portion of polycrystalline silicon which is positioned exteriorly of the first ring of polycrystalline silicon. Where the peripheral portion 7 is fabricated in the form of the double coaxial rings as described above, the number of method steps increases but the number of masks is not increased. In any event, a capacitor of a high capacitance for a cell size can be fabricated.

While in the foregoing embodiment the principal portion 6 of the first electrode 10 has been illustrated and described as shaped to assume a generally rectangular cubic configuration, the principal portion of the first electrode 10 may be so shaped as to assume a cup-like configuration. The semiconductor memory element having the principal portion of a generally cup-like configuration according to a second preferred embodiment of the present invention will now be described with reference to FIG. 3 including of FIGS. 3A, 3B, 3C, 3D, 3E and 3F. It is, however, to be noted that in describing the second preferred embodiment of the present invention only differences of the second preferred embodiment of the present invention from the first preferred embodiment of the present invention will be described for the sake of brevity.

Figure 3A:
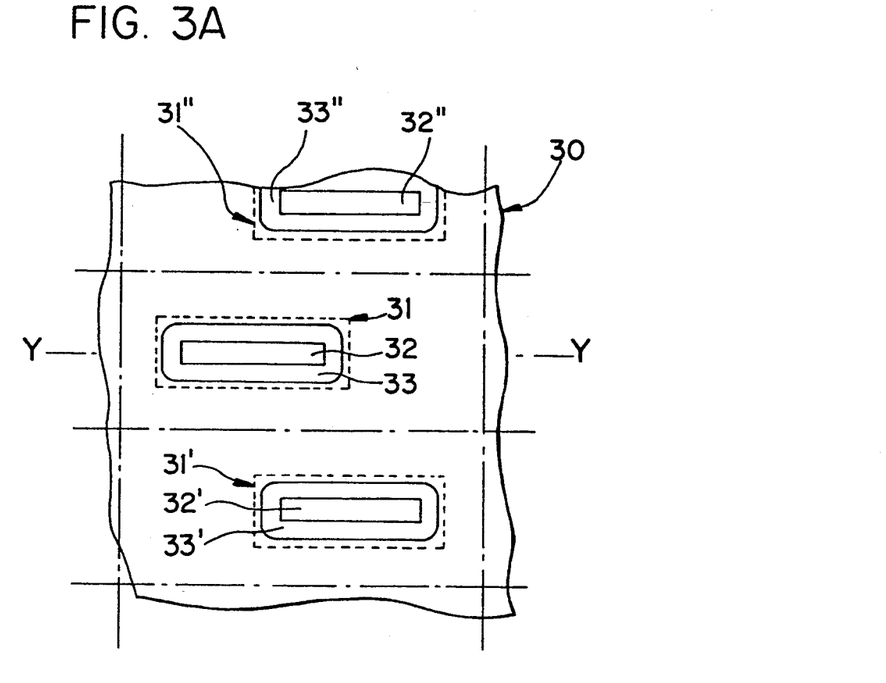
FIGS. 3A, 3C and 3E are top plan views of the semiconductor memory device, illustrating the sequence of manufacture thereof at different process steps according to a second preferred embodiment of the present invention.
Figure 3B:
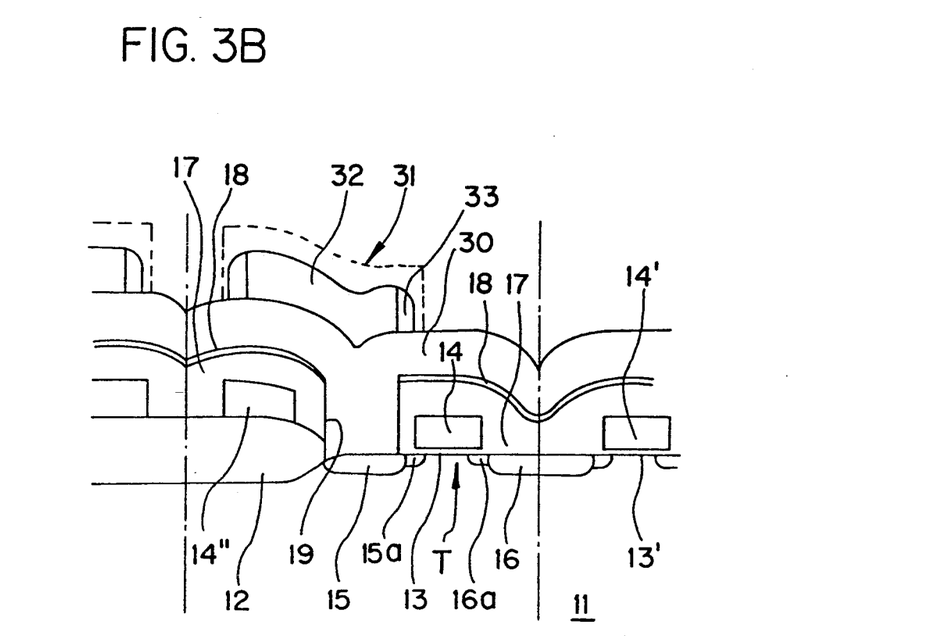
FIGS. 3B, 3D and 3F are cross-sectional views taken along the lines Y—Y in FIGS. 3A, 3C and 3E, respectively.

Method Step 11—FIGS. 3A and 3B:

As illustrated in FIGS. 3A and 3B, by performing the method step 1 described with reference to FIGS. 2A and 2B, the contact hole 19 is first formed, followed by the formation of a phosphor-doped polycrystalline silicon layer 30 of a relatively large thickness as a material for the first electrode of the capacitor and then followed by the formation of a PSG layer 31. The PSG layer 31 is processed using a resist formed by the use of a lithographic technique and is then etched somewhat by the use of an etching solution containing hydrofluoric acid (HF) to provide a generally shrunk PSG layer 32. Then, after a $SiO_2$ layer has been deposited over the entire surface by the use of the LPCVD process, a portion of the $SiO_2$ corresponding to a flat portion is removed by the use of the reactive ion etching process to allow a portion of the $SiO_2$ to remain on a side wall of the PSG layer 32.

Figure 3C:
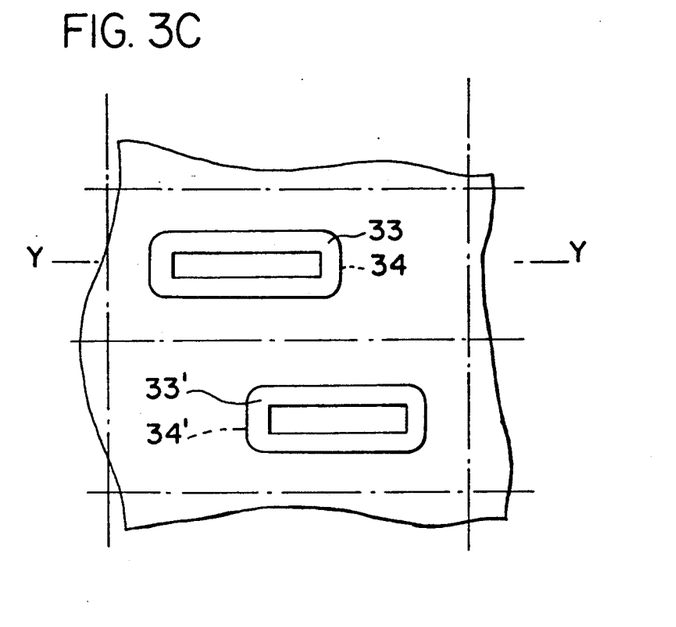
Figure 3D:
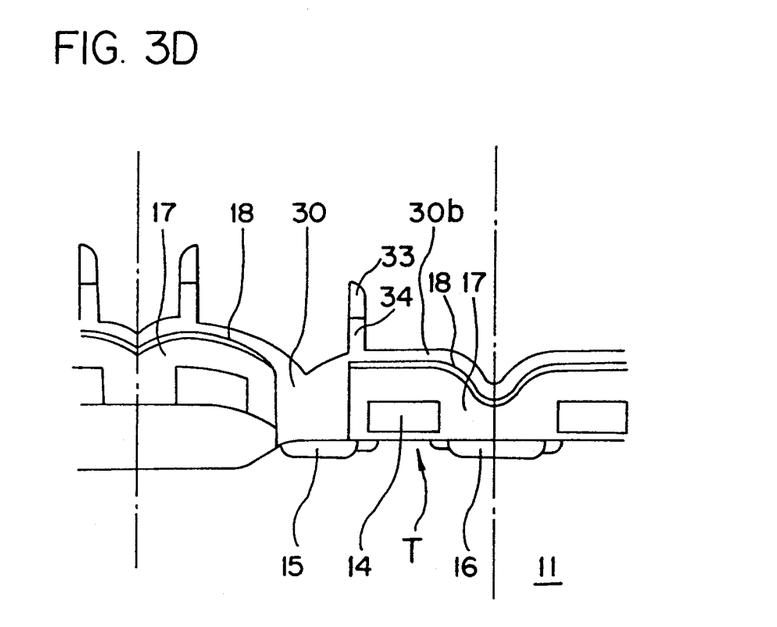

Method Step 12—FIGS. 3C and 3D:

Then, using an etching solution containing hydrofluoric acid (HF), the PSG layer 32 is removed. The $SiO_2$ layer 33 left remaining on the side wall remains unremoved as illustrated in FIGS. 3C and 3D because the etching rate is low when compared with the PSG layer 32. Thereafter, the $SiO_2$ layer 33 on the side wall is left as a mask, followed by the etching of the polycrystalline silicon layer 30 of thick film with the use of the reactive ion etching process. This etching is interrupted while a thin film portion 30b of the polycrystalline silicon layer 30 is left unremoved. In this way, a generally cup-shaped electrode 34 can be formed as the principal portion of the first electrode of the capacitor C.

Figure 3E:
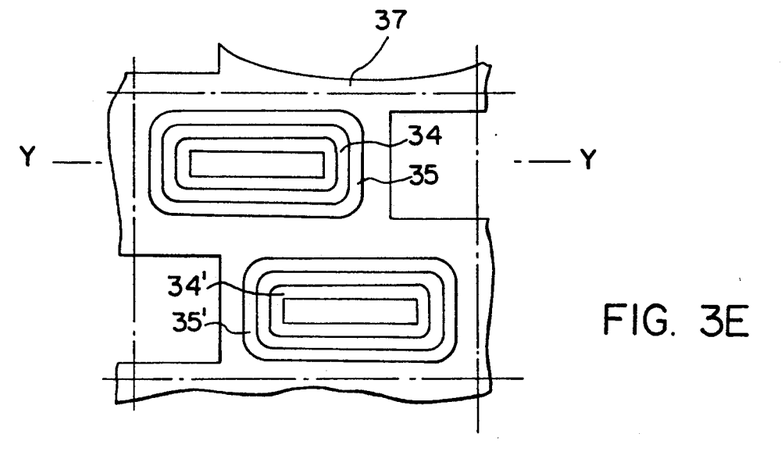
Figure 3F:
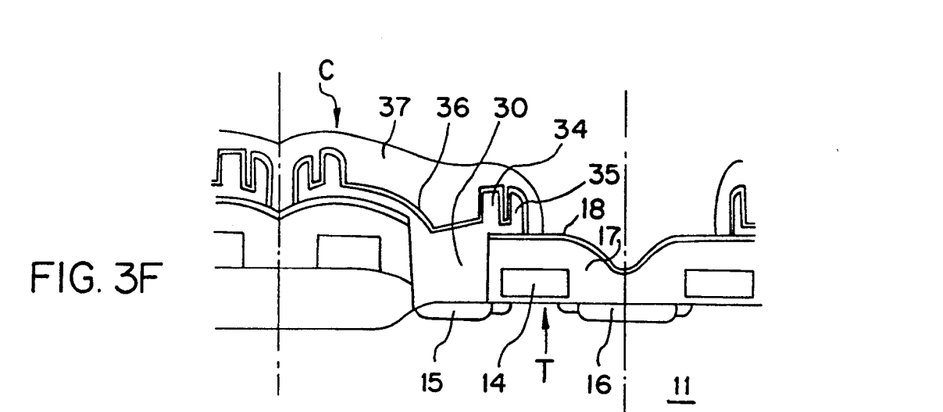

Method Step 13:

The method steps subsequent to the method step 12 are substantially identical with the method steps described in connection with the first preferred embodiment of the present invention, and a generally ring-shaped peripheral portion 35 and a bottom portion 30b are formed exteriorly adjacent the cup-shaped electrode 34, followed by the formation of a plate electrode 37 after the formation of a capacitor insulating layer 36.

The semiconductor memory element manufactured in the above described manner has a capacitance per cell of 38 fF when the peripheral portion 35 is provided is whereas the capacitance per cell 18 fF when no peripheral portion is provided is. Thus, as is the case with the first preferred embodiment of the present invention, the capacitance could be increased for a cell size. The above mentioned data on the capacitance were obtained when the polycrystalline silicon layer 30 is 0.4 $\mu$m in film thickness and the same conditions as in the first preferred embodiment of the present invention were employed.

As hereinbefore described, the semiconductor memory device of the present invention includes a plurality of memory cells each including a transistor formed on a surface of a semiconductor substrate and having one terminal, and a capacitor formed on the semiconductor substrate and having first and second electrodes, with the first electrode being connected with one terminal of the transistor. The first electrode of the capacitor includes a principal portion of either a generally rectangular cubic configuration or a generally cup-shaped configuration, a peripheral portion spaced from and surrounding a peripheral side wall of the principal portion and a bottom portion connecting an end of the principal portion with an end of the peripheral portion. On the other hand, the second electrode of the capacitor includes respective portions confronting the principal portion, the peripheral portion and the bottom portion of the first electrode. Accordingly, a capacitor of a capacitance hitherto achieved in the conventional stacked memory cell can be realized and, even when a DRAM of 16M or a higher capacity is to be fabricated in a high density, a charge storage capacitance higher than the minimum value can be secured.

Where the number of each of the peripheral portion and the bottom portion of the first electrode is plural, the further enlargement of the capacitance for a memory size can be realized.

Also, according to the present invention, the method of making the semiconductor memory device includes a step of forming a peripheral side wall made of a material selectively etched relative the electroconductive thick film and surrounding a periphery of the side wall of the principal in contact therewith, and a step of forming a peripheral portion made of electroconductive material resistant to a corrosive used for the material for the peripheral side wall, where the peripheral portion surrounds the peripheral side wall in contact therewith and has an end portion connected therethrough to the thin film portion. Accordingly, with no need to increase the number of masks, the peripheral portion can be provided in a self-aligned fashion with the principal portion. Therefore, the distance between each neighboring capacitor of the memory cells can be minimized to a value smaller than the limitation imposed by the lithographic technique which enables a high density integration of elements.

Also, where the respective steps of forming the peripheral portion and the bottom portion are repeated, the capacitor of an enlarged capacitance can be formed with a minimized number of method steps and without an increase in the number of the masks being necessary.

Although the present invention has been fully described in connection with the preferred embodiments thereof with reference to the accompanying drawings, it is to be noted that various changes and modifications are apparent to those skilled in the art. By way of example, while in any one of the foregoing embodiments of the present invention reference has been made to a cell structure of a so-called folded-bit-line system, the present invention can be equally applicable to the cell structure of open-bit-line system. Also, while N-channel MOS transistors have been formed on the P-type silicon substrate to provide memory cell transistors, the N-channel MOS transistors may be formed in a P-type region on a N-type silicon substrate or P-channel MOS transistors may be formed on a N-type silicon substrate or an N-type region on a P-type silicon substrate to provide the memory cell transistors.

Also, with respect to the shape of the element separating region, the detailed structure thereof and the method of forming the element separating region, the material for the electrodes of each capacitor, the structure thereof and the method of forming the capacitors, and the material for the capacitor insulating layer, the structure thereof and the method of forming the capacitor insulating layer, the present invention should not be limited to the structure and method disclosed herein in connection with any one of the preferred embodiments thereof.

Accordingly, such changes and modifications are to be understood as included within the scope of the present invention as defined by the appended claims unless they depart therefrom.

What is claimed is:

1. A method of making a memory cell having a transistor and a stacked capacitor, comprising the steps of:
    (a) forming a first conductive film over a semiconductor substrate after an insulating film has been deposited over the transistor formed on said semiconductor substrate and a contact hole has subsequently been formed in said insulating film;
    (b) forming a first mask pattern on said first conductive film and anisotropically etching substantially halfway said first conductive film, with said first mask pattern used as a mask, so as to leave a bottom thereof;
    (c) forming a second mask film only on a side wall portion of said first conductive film which has been formed by a partial etching, and depositing a second conductive film over an entire surface of said second mask film;
    (d) anisotropically etching an entire surface of said second conductive film so as to leave a portion of said second conductive film on a side wall portion of said second mask film while permitting said second conductive film to be connected with the bottom of said first conductive film;
    (e) removing a bottom portion of said first conductive film which fails to be covered by said second conductive film, said second mask film and said first mask pattern; and
    (f) after said first mask pattern and said second mask film have been removed, forming a capacitor insulating film over an entire surface followed by a formation of a third conductive film over said capacitor insulating film, whereby lower and upper electrodes of the capacitor are formed by said first and second conductive films, respectively.

2. The method as claimed in claim 1, wherein said steps (c) and (d) are repeated.

3. The method as claimed in claim 1, wherein said step (e) is carried out subsequent to an etching of said second conductive film.

4. The method as claimed in claim 1, wherein said first conductive film is etched off by said first mask pattern in a shape similar to a generally cup-shaped configuration.

* * * * *